United States Patent
Fontana et al.

[11] Patent Number: 6,133,769
[45] Date of Patent: Oct. 17, 2000

[54] PHASE LOCKED LOOP WITH A LOCK DETECTOR

[75] Inventors: Fabiano Fontana, San Jose, Calif.; Mathew Anton Rybicki; Ammisetti V. Prasad, both of Austin, Tex.

[73] Assignee: Vantis Corporation, Sunnyvale, Calif.

[21] Appl. No.: 09/201,081

[22] Filed: Nov. 30, 1998

[51] Int. Cl.[7] .................................................. H03L 7/06
[52] U.S. Cl. ............................ 327/156; 327/157; 327/3
[58] Field of Search .......................... 327/156, 157, 327/2, 3, 5, 12, 147, 148

[56] References Cited

U.S. PATENT DOCUMENTS

| | | | |
|---|---|---|---|
| 3,080,533 | 3/1963 | edwards | 327/156 |
| 5,784,122 | 7/1998 | Nayebi et al. | 327/157 |
| 5,870,002 | 2/1999 | Ghaderi et al. | 327/156 |
| 5,978,427 | 11/1999 | Kuhara | 327/156 |

*Primary Examiner*—Toan Tran
*Assistant Examiner*—Paul Dinh
*Attorney, Agent, or Firm*—Fliesler, Dubb, Meyer & Lovejoy

[57] ABSTRACT

A phase locked loop comprises a phase locking circuit (16) which includes a phase/frequency detector (18) capable of outputting up and down signals to a charge pump (22) through separate signal paths (24, 26) and a phase lock detector (34) coupled to receive the up and down signals. The phase lock detector (34) determines the difference between the up and down signals from the phase/frequency detector (18) and in response generates a phase lock indicator signal PLL_OUT.

36 Claims, 4 Drawing Sheets

FIG. 1

(PRIOR ART)

FIG. 3

(PRIOR ART)

PHASE LOCKED LOOP WITH A LOCK DETECTOR

BACKGROUND OF THE INVENTION

1. Technical Field

The present invention relates to a phase locked loop, and more particularly, to a phase locked loop used with a clock tree of a field programmable gate array (FPGA).

2. Background Art

Conventional phase locked loops have been developed by the electronics industry to provide precise phase and frequency locking in various applications in which precise timing of clock signals is required. An example of a typical application in which a conventional phase locked loop can be implemented to provide precise phase and frequency locking of clock signals is a conventional matrix clock tree in an FPGA with interconnect encoding. An example of a conventional FPGA with interconnect encoding is described in U.S. Pat. No. 5,723,984, incorporated herein by reference, assigned to Advanced Micro Devices, Inc., the assignee of the present invention.

Figure 1:
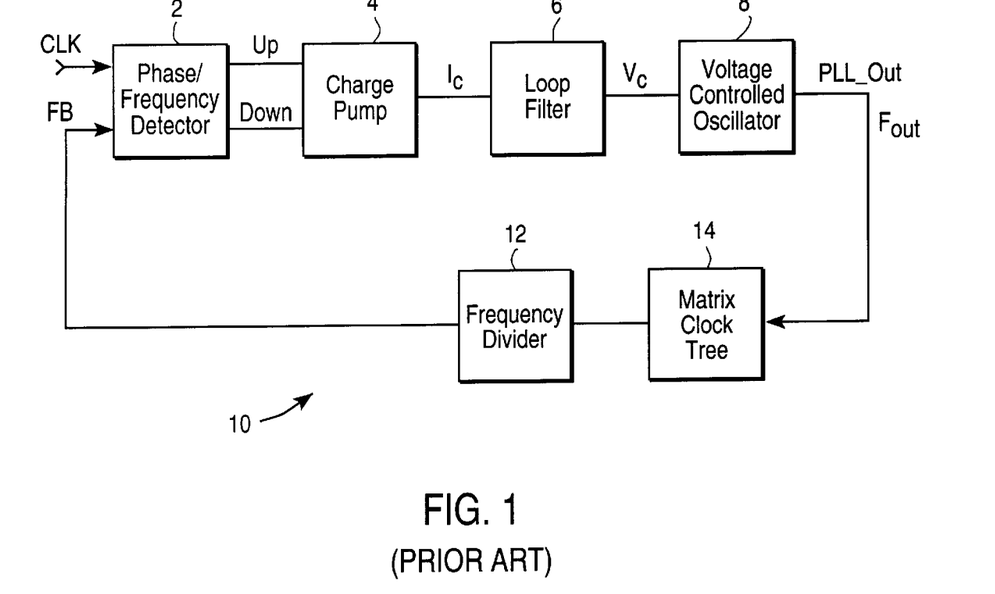
FIG. 1, described above, is a block diagram showing a conventional phase locked loop with a matrix clock tree receiving a phase locked loop output signal.
Figure 2A:
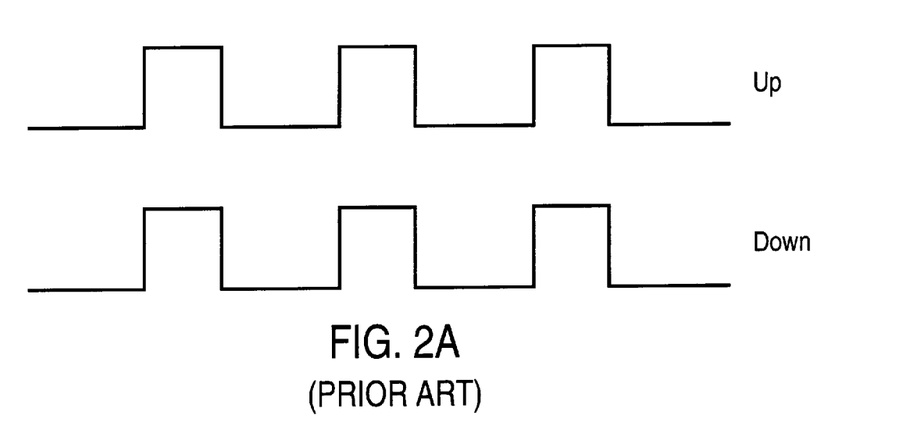
FIG. 2A, described above, shows typical pulses of the up and down signals generated by the phase/frequency detector indicating a perfect phase lock in the conventional phase locked loop as shown in FIG. 1.

FIG. 1 shows a block diagram of a conventional phase locked loop which typically includes a phase/frequency detector 2, a charge pump 4, a loop filter 6, and a voltage controlled oscillator 8 which generates a phase locked loop output signal PLL_OUT at a frequency $F_{out}$. The phase/frequency detector 2 compares the phase and frequency of an input clock signal CLK with those of a feedback signal FB and in response generates phase/frequency correction signals for the charge pump 4. The phase/frequency correction signals comprise an up signal and a down signal transmitted on two separate signal paths. The up and down signals depend upon the relationship of the phase of the feedback signal FB to the input clock signal CLK. For example, when the input clock signal CLK and the feedback signal FB are in a perfect phase lock, the up and down signals generated by the phase/frequency detector 2 have perfectly matched pulses with an equal pulse width, as shown in FIG. 2A.

Figure 2B:
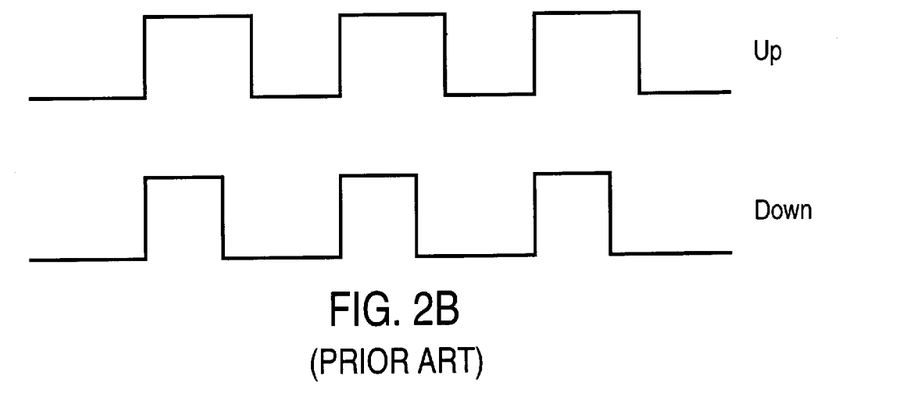
FIG. 2B, described above, shows typical pulses of the up and down signals generated by the phase/frequency detector when an upshifting of the phase locked loop output signal PLL_OUT is desired in the conventional phase locked loop as shown in FIG. 1.

FIG. 2B shows the pulses of the up and down signals when an upshifting of the phase locked loop output signal PLL_OUT is required to enable the feedback signal FB to be phase locked with the input clock signal CLK. In this case, the pulse width of the up signal is greater than that of the down signal. The leading edges of the corresponding pulses of the up and down signals are timed to coincide with each other, whereas the trailing edges of the up signal pulses lag behind those of the corresponding down signal pulses.

Figure 2C:
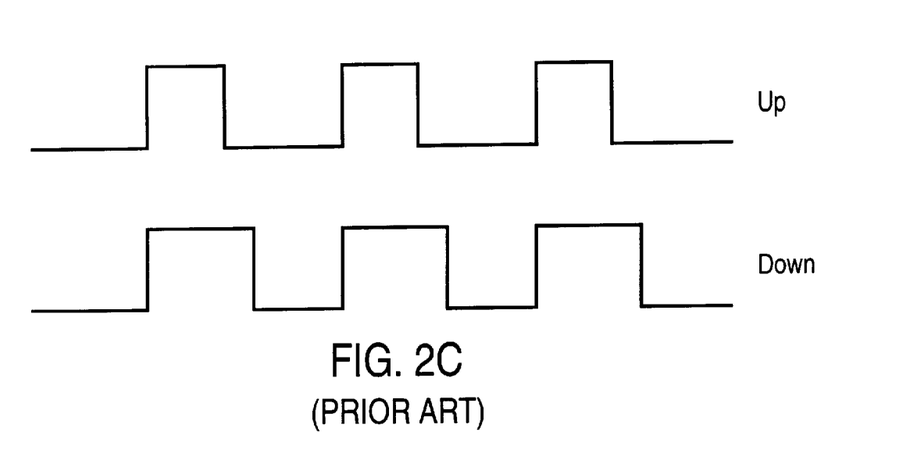
FIG. 2C, described above, shows typical pulses of the up and down signals generated by the phase/frequency detector when a downshifting of the output signal PLL_OUT is desired in the conventional phase locked loop as shown in FIG. 1.

FIG. 2C shows the up and down signal pulses when a downshifting of the phase locked loop output signal PLL_OUT is required to enable the feedback signal FB to be phase locked with the input clock signal CLK. In this situation, the pulse width of the down signal is greater than that of the up signal. The leading edges of the corresponding pulses of the up and down signals are timed to coincide with each other, whereas the trailing edges of the down signal pulses lag behind those of the corresponding up signal pulses.

Referring back to FIG. 1, the charge pump 4 generates a pump current $I_c$ in response to receiving the up and down signals from the phase/frequency detector 2. The charge pump 4 detects a difference between the pulse width of the up and down signals generated by the phase/frequency detector 2 and adjusts the pump current $I_c$ if the pulses of the up and down signals do not match each other. For example, when the input clock signal CLK and the feedback signal FB are in a perfect phase lock and the up and down signal pulses are perfectly matched as shown in FIG. 2A, no phase or frequency shift in the output signal PLL_OUT is required, and therefore no change in the pump current $I_c$ is required.

In the case in which the phase/frequency detector 2 outputs up and down signal pulses as shown in FIG. 2B, the charge pump 4 determines that the pulse width of the up signal is greater than that of the down signal and in response adjusts the pump current $I_c$ upward to increase the frequency $F_{out}$ of the output signal PLL_OUT, such that the frequency of the feedback signal FB is increased to achieve a phase lock with the input clock signal CLK. In the case in which the phase/frequency detector 2 outputs up and down signal pulses as shown in FIG. 2C, the charge pump 4 determines that the pulse width of the down signal is greater than that of the up signal and in response adjusts the pump current $I_c$ downward to decrease the frequency of the output signal PLL_OUT in order to achieve a phase lock between the signals CLK and FB.

The loop filter 6 in FIG. 1 may be either a conventional passive loop filter or a conventional active loop filter which filters out undesirable noises and high frequency jitters in the pump current signal $I_c$ generated by the charge pump 4. The loop filter may be a conventional resistor-capacitor (RC) low pass filter well known to a person skilled in the art.

The loop filter 6 outputs a control voltage $V_c$ to the voltage controlled oscillator 8, which in response generates a phase locked loop output signal PLL_OUT having an output frequency $F_{out}$. The output frequency $F_{out}$ generated by the voltage controlled oscillator 8 is dependent upon the control voltage $V_c$. In a feedback loop 10, the conventional phase locked loop may include a frequency divider 12 which divides the output frequency $F_{out}$ of the phase locked loop by a predetermined divisor to generate the feedback signal FB. The divisor, that is, the ratio of the frequency $F_{out}$ of the phase locked loop output signal PLL_OUT to the frequency of the feedback signal FB, is determined by the desired frequency $F_{out}$ of the output signal PLL_OUT relative to the frequency of the input clock signal CLK. If the frequency of the output signal PLL_OUT is desired to be the same as that of the input clock signal CLK, then the frequency divider need not be provided in the feedback loop 10.

The phase locked loop output signal PLL_OUT may be provided as a timing signal to a conventional matrix clock tree 14, such as the one for distributing a clock signal to a plurality of configurable logic blocks (CLBs) in an FPGA, as described in U.S. patent application Ser. No 09/199,664, entitled "A Clock Tree Topology" filed Nov. 25, 1998, by Bradley Sharpe-Geisler, incorporated herein by reference. The phase-locked loop output PLL_OUT generated by the conventional phase locked loop as shown in FIG. 1 may also be provided as a clock signal for many other applications known to a person skilled in the art.

Figure 3:
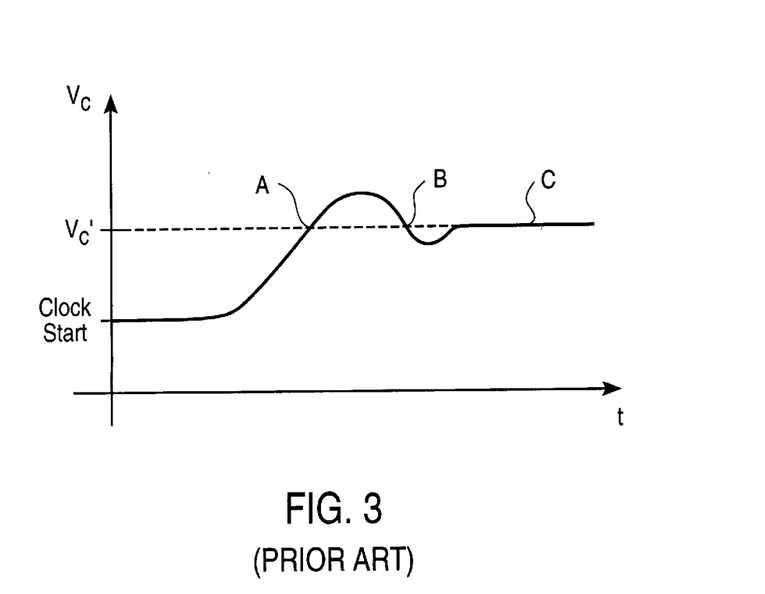
FIG. 3, described above, shows a typical curve of loop filter control voltage versus time ($V_c$ vs. t) indicating potential false phase locks prior to achieving a true phase lock by the conventional phase locked loop as shown in FIG. 1.

When the input clock signal CLK is initially provided to the phase/frequency detector 2 in the conventional phase locked loop as shown in FIG. 1, the control voltage $V_c$ from the loop filter 6 may take a finite time before it settles to a steady-state voltage level to achieve a phase lock. A typical curve of the loop filter control voltage vs. time ($V_c$ vs. t) is illustrated in FIG. 3, which shows the magnitude of the loop filter control voltage $V_c$ from the time of starting the input clock signal CLK to the time of achieving a steady-state voltage $V_c'$ at point C. Prior to achieving a steady state at point C, the loop filter control voltage $V_c$, which controls the frequency $F_{out}$ of the phase locked loop output signal PLL_OUT, may swing upward and downward due to relatively large variations in the up and down signals from the phase/frequency detector 2 shortly after the phase locking operation is initiated.

The voltage swing in $V_c$ during a transient state prior to achieving the steady state may cause the conventional phase locked loop as shown in FIG. 1 to achieve a false phase lock when it is still in the transient state. For example, the curve ($V_c$ vs. t) as shown in FIG. 3 crosses the steady state loop filter voltage $V_c'$ at points A and B prior to achieving the "true" steady state at point C. When the voltage $V_c'$ is applied to the voltage controlled oscillator 8 in FIG. 1, the phase locked loop output signal PLL_OUT is at the desired phase locked frequency. However, when the loop filter voltage $V_c$ crosses the voltage level $V_c'$ at points A and B during the voltage swing prior to achieving the steady state, a "false" phase lock may occur at either point A or B.

In order to avoid data errors which may occur due to a false lock from a phase locked loop in a circuit, such as an FPGA, fixed time delays have been provided after clock start. However, a fixed time delay does not ensure a true phase lock because the duration of the transient state prior to achieving the steady state may not be the same for each phase locking operation. A very long delay to assure that false locks do not occur is also undesirable due to fast circuit start up time requirements for many circuits.

Because the conventional phase locked loop as shown in FIG. 1 is unable to differentiate between a false phase lock at point A or B and a true phase lock at point C on the curve ($V_c$ vs. t), there is a need for a phase locked loop that is able to determine that a true phase lock is achieved when the loop filter control voltage $V_c$ is in a steady state.

SUMMARY OF THE INVENTION

The present invention satisfies this need. In accordance with the present invention, a phase locked loop generally comprises:
(a) a phase locking circuit comprising a phase detector having inputs capable of receiving an input clock signal and a feedback signal, and outputs capable of outputting an up signal and a down signal in dependence upon a phase difference between the input clock signal and the feedback signal; and
(b) a phase lock detector, having inputs coupled to the phase detector, capable of detecting a difference between the up and down signals and in response generating a phase lock indicator signal in dependence upon whether the difference between the up and down signals is within a predetermined threshold difference.

In an embodiment, the phase locking circuit further comprises a charge pump, coupled to the phase detector, capable of generating a pump current in response to the up and down signals. In a further embodiment, the phase locking circuit further comprises a loop filter, coupled to the charge pump, capable of filtering the pump current to generate a control voltage. In yet a further embodiment, the phase locking circuit further comprises a voltage controlled oscillator, coupled to the loop filter, capable of generating a phase locked signal at an oscillator frequency in dependence upon the control voltage generated by the loop filter.

In an embodiment, the phase locking circuit in the phase locked loop according to the present invention further comprises an output frequency divider, coupled to the voltage controlled oscillator, capable of dividing the oscillator frequency of the phase locked signal to generate a phase locked output signal having a desired output frequency. For digital applications, the output frequency divider is capable of generating a phase-locked output signal with a clipped sinusoidal waveform or a substantially rectangular waveform at a desired duty cycle. For example, the output frequency divider may have a divisor of two to generate a rectangular waveform having a 50% duty cycle.

The phase locking circuit in the phase locked loop according to the present invention may further comprise a feedback frequency divider, coupled between the output frequency divider and the phase detector in a feedback loop, capable of dividing the output frequency to generate a feedback signal. The phase detector, which is coupled to receive both the input clock signal and the feedback signal, detects a difference between the phases of the input clock signal and of the feedback signal and in response generates the up and down signals for the charge pump. In an embodiment, the pump current generated by the charge pump depends upon the difference between the pulse widths of the up and down signals generated by the phase detector and whether the pulse width of the up signal is greater than that of the down signal. In a further embodiment, the feedback frequency divider comprises a programmable frequency divider with a variable divisor to divide the output frequency of the phase locked loop to generate the feedback input to the phase detector. The divisor of the programmable feedback frequency divider depends upon the ratio of the desired output frequency of the phase locked loop to the frequency of the input clock signal.

In an embodiment, the phase lock detector comprises an Exclusive OR (XOR) gate having inputs coupled to receive the up and down signals from the phase detector and, a filter coupled to the XOR gate. The filter in the phase lock detector is a low pass filter capable of filtering out narrow pulses generated by the XOR gate due to small variations in the up and down signals when the phase locked loop is in a steady-state phase lock. In a further embodiment, a disable input capable of disabling the phase lock indicator signal output is provided to the phase lock detector. When a disable signal is applied to the phase lock detector in accordance with the present invention, the phase lock indicator signal output is disabled even if the phase lock detector determines that a true phase lock is achieved by the phase locked loop.

Advantageously, the present invention provides a phase locked loop with a lock detector which is capable of receiving the up and down signals from the phase detector, and generating a phase lock indicator signal upon determining the characteristics of variations between the up and down signals. A phase lock is detected by the lock detector even though it allows for some small variations between the up and down signal pulses generated by the phase detector when the phase locked loop is in a steady-state phase lock. When the phase lock detector detects a large difference between the up and down signals indicating a large phase or frequency variation when the phase locked loop is in the transient state, the phase lock detector does not generate the lock indicator signal, thereby avoiding an indication of a false phase lock.

BRIEF DESCRIPTION OF THE DRAWINGS

The present invention will be described with respect to particular embodiments thereof, and references will be made to the drawings in which.

DETAILED DESCRIPTION

Figure 4:
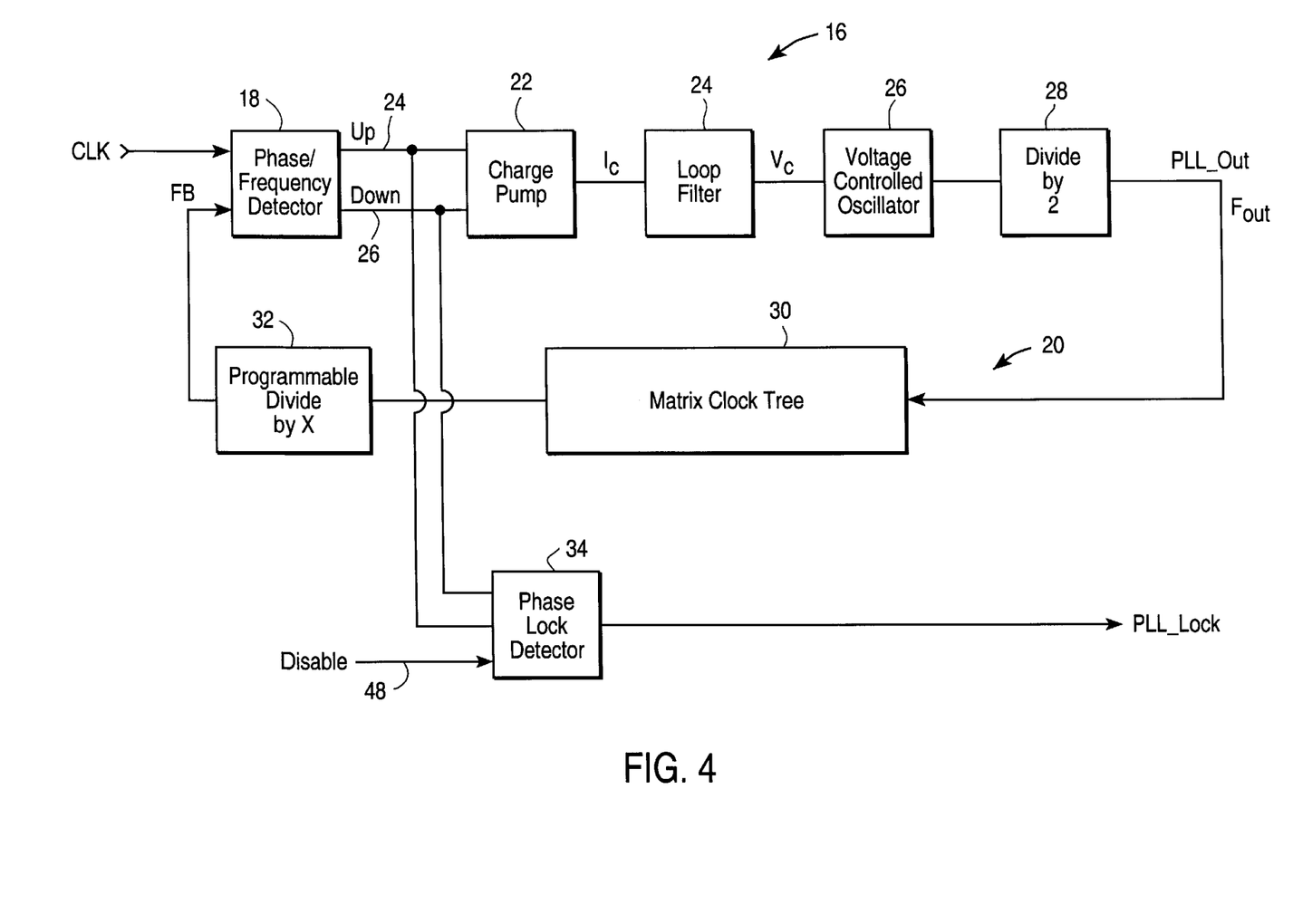
FIG. 4 is a block diagram showing an embodiment of a phase locked loop with a phase lock detector in accordance with the present invention.

FIG. 4 shows a block diagram illustrating a phase locked loop with a lock detector in accordance with the present invention. The phase locked loop comprises a phase locking circuit 16 which includes a phase/frequency detector 18 having inputs capable of receiving an input clock signal, also called a pad clock signal, and a feedback signal FB from a feedback loop 20 of the phase locked loop. The phase/frequency detector 18 outputs an up signal and a down signal in response to detecting a phase difference or a frequency difference between the input clock signal and the feedback signal.

In an embodiment, the up and down signals generated by the phase/frequency detector 18 are transmitted to the charge pump 22 through two separate signal paths 24 and 26. The pulse patterns for the up and down signals are the same as those shown in FIGS. 2A–2C and described above. In a perfect phase lock, the up and down signal pulses exactly match each other, as shown in FIG. 2A. In practical situations, a "true" phase lock is deemed to have been achieved even though there might be slight variations between the corresponding pulses of the up and down signals. When the pulse width of the up signal is greater than that of the down signal, as shown in FIG. 2B, the phase/frequency detector 18 indicates to the charge pump 22 that an upshifting of the frequency $F_{out}$ of the phase locked loop output signal PLL_OUT is required. On the other hand, if the pulse width of the down signal is greater than that of the up signal, as shown in FIG. 2C, the phase/frequency detector 18 indicates to the charge pump 22 that a downshifting of the output frequency $F_{out}$ is required to achieve a phase lock.

The charge pump 22 is a current generator which generates a pump current $I_c$ in response to detecting a difference between the up and down signals from the phase/frequency detector 18. The magnitude of the pump current $I_c$ depends upon the difference between the up and down signals and whether the up and down signals received from the phase/frequency detector 18 require an upshifting or a downshifting of the output frequency $F_{out}$ in order to achieve a phase lock. The pump current $I_c$ determines the frequency $F_{out}$ of the output clock signal PLL_OUT of the phase locked loop.

Because the pulses of the up and down signals may not exactly match due to slight excursions even though a phase lock is achieved, the charge pump 22 may detect the difference between the up and down signals as very narrow pulses. These narrow pulses may cause high frequency jitters in the pump current $I_c$. A loop filter 24 is coupled to the charge pump 22 in an embodiment to filter out undesirable noises and jitters in the pump current signal $I_c$ and to generate a control voltage $V_c$.

The loop filter 24 in the phase locked loop as shown in FIG. 4 may be either a conventional passive loop filter or an active loop filter known to a person skilled in the art. For example, the loop filter may be a conventional resistor-capacitor (RC) low pass filter. The time constant RC determines the passband of the loop filter 24. The transfer functions of the loop filter 24 may be designed according to a desired overall response of the phase locked loop and are well known to a person skilled in the art.

A voltage controlled oscillator 26, which is coupled to receive the control voltage $V_c$ from the loop filter 24, generates a phase locked signal at an oscillator frequency which is determined by the loop filter control voltage $V_c$. In digital applications in which the phase locked loop output PLL_OUT signal is desired to be a digital clock signal, the voltage controlled oscillator 26 may generate a substantially rectangular waveform or a clipped sinusoidal waveform which approximates a digital signal.

If a different phase locked output clock signal PLL_OUT is desired, an output frequency divider 28 may be coupled to the voltage controlled oscillator 26 in an embodiment to divide the oscillator frequency by a predetermined divisor to generate the phase locked output clock signal PLL_OUT at the desired output frequency $F_{out}$. For example, the output frequency divider 28 may be provided to divide the oscillator frequency by two to generate a phase locked output digital clock signal PLL_OUT with a duty cycle of 50%.

In an application in which the phase locked loop according to the present invention is used for precise phase locking of a clock signal for a conventional FPGA, the phase locked output clock signal PLL_OUT may be provided to a matrix clock tree 30 which distributes the clock signal to a plurality of CLBs in the FPGA. The matrix clock tree 30 may be a conventional clock tree in a typical FPGA architecture known to a person skilled in the art. For example, the phase locked loop according to the present invention may be used to provide a phase locked clocking signal for a matrix clock tree in an FPGA as described in U.S. patent application Ser. No. 09/199,664, previously referenced.

If the desired frequency $F_{out}$ of the output clock signal PLL_OUT is multiplied when distributed through a chip to a frequency greater than the frequency of the input pad clock signal CLK, a feedback frequency divider 32 may be provided within the feedback loop 20 in an embodiment. The feedback frequency divider 32 has an integral divisor equal to the integral multiple such that the phase/frequency detector 18 is able to compare the frequency of the feedback signal FB with that of the input pad clock signal CLK. In a further embodiment in which the frequency $F_{out}$ of the phase locked output clock signal is variably changed when distributed to a chip, the feedback frequency divider 32 may be a programmable frequency divider with a variable divisor, depending upon the relationship of the desired frequency $F_{out}$ of the output clock signal PLL_OUT with respect to the frequency of the input pad clock signal CLK. If the frequency of the phase locked output clock signal PLL_OUT is desired to be the same as that of the input pad clock signal CLK, then no frequency divider need be provided in the feedback loop 20, and the feedback signal FB is transmitted directly from the matrix clock tree 30 to the phase/frequency divider 18.

In accordance with the present invention, the phase locked loop further comprises means for detecting a phase lock, coupled to receive the up and down signals from the phase detector 18, and capable of generating a phase lock indicator signal PLL_LOCK, in dependence upon whether the difference between the up and down signals is within a predetermined threshold. In an embodiment, the means for detecting the phase lock comprises a phase lock detector 34 which has inputs coupled to the up and down signal paths 24 and 26 leading from the outputs of the phase/frequency detector 18. The phase lock detector 34 is capable of determining a difference between the up and down signals from the frequency detector which indicates a phase or frequency variation between the feedback signal FB and the input pad clock signal CLK, and in response generating a phase lock indicator signal PLL_LOCK if the variation between the up and down signals is within the predetermined threshold.

In a typical phase locked loop operation, some small variations between the up and down signals are sometimes present even when the phase locked loop is in a steady-state phase lock. Therefore, the phase lock detector 34 is designed to allow for some small variations in the up and down signals generated by the phase/frequency detector 18 while indicating a true steady-state phase lock.

The threshold variation may be designed in the phase lock detector 34 such that it outputs the lock indicator signal PLL_LOCK to signify a "true" phase lock when the variation between the up and down signals is within the threshold, even though the up and down signal pulses are not perfectly matched. The phase lock indicator signal PLL_LOCK generated by the lock detector 34 may be either used internally as a clock enable signal for a conventional FPGA or routed to an output pad.

Figure 5:
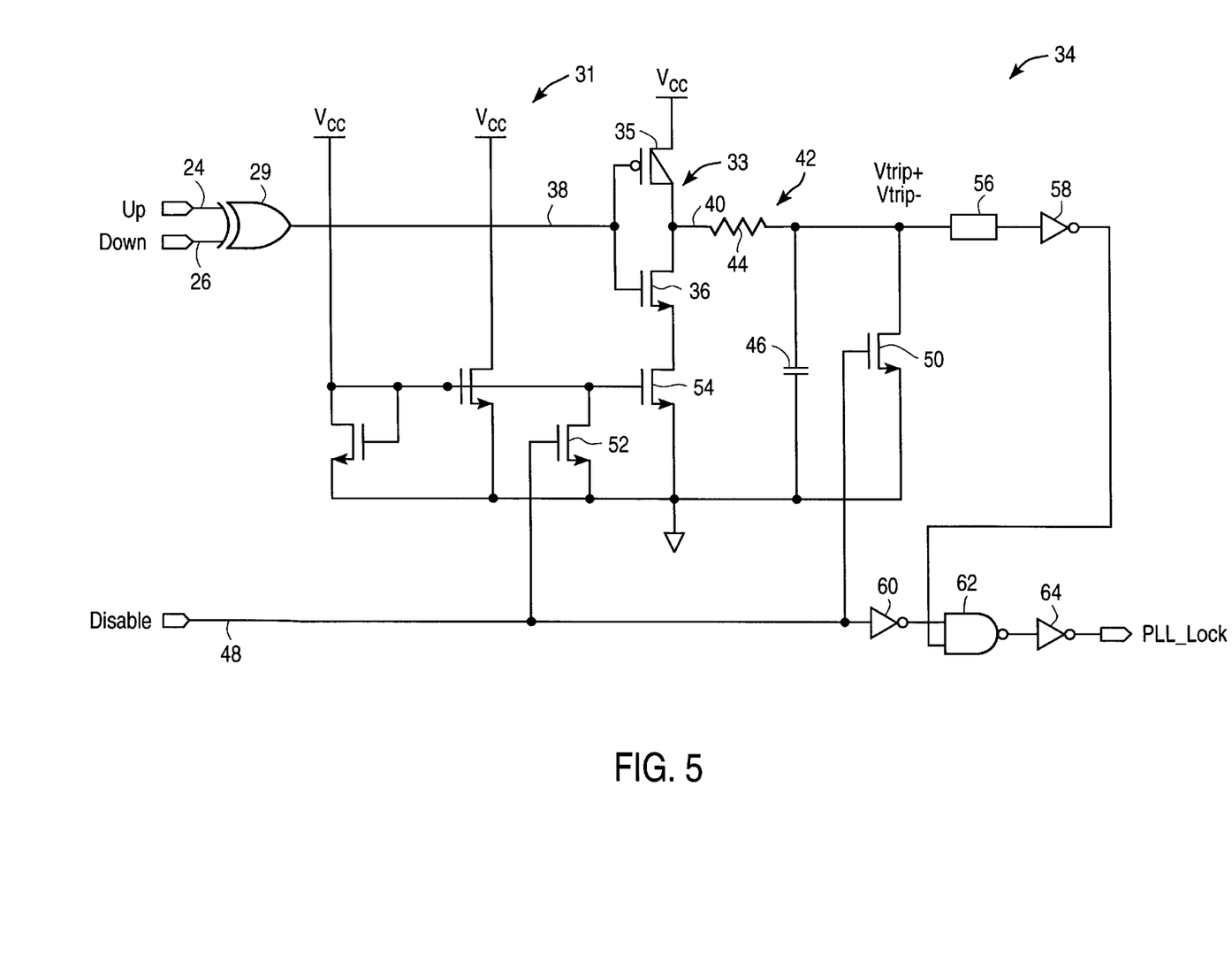
FIG. 5 shows a circuit diagram of an embodiment of the phase lock detector in the phase locked loop according to the present invention.

FIG. 5 shows an embodiment of a phase lock detector 34 in the phase locked loop according to the present invention. In this embodiment, the up and down signals on the signal paths 24 and 26 are transmitted to an XOR gate 29 which outputs the result of XORing the up and down signals to a metal oxide semiconductor (MOS) transistor network 31. In an embodiment, the MOS transistor network 31 includes a complementary MOS (CMOS) logic inverter 33 which comprises a pair of PMOS and NMOS transistors 35 and 36 with an input 38 connected to the XOR gate 29 and an output 40 connected to a low pass filter 42. In an embodiment, the low pass filter 42 comprises a resistor 44 and a capacitor 46, with the voltage across the capacitor 46 being the output of the filter 42. The frequency response of the filter 42 is characterized by a time constant RC, which is the product of the resistance (R) of the resistor 44 and the capacitance (C) of the capacitor 46.

In a further embodiment, the lock detector 34 according to the present invention further includes a DISABLE input 48 coupled to the MOS transistor network 31. When the DISABLE input 48 is in an "on" state, that is, at a high voltage, NMOS transistors 50 and 52 are turned on while the NMOS transistor 54 is turned off. In an embodiment, the output of the low pass filter 42 is coupled to an inverter 56, such as a Schmitt trigger, with hysteresis characterized by voltages $V_{trip+}$ and $V_{trip-}$. The Schmitt trigger 56 is connected to an inverter 58, and the DISABLE input 48 is inverted by another inverter 60. The outputs of the inverters 58 and 60 are coupled to the inputs of a NAND gate 62, the output of which is inverted by yet another inverter 64. When the DISABLE input 48 is in an "off" state, the output of the inverter 64 is capable of generating the phase lock indicator signal PLL_LOCK, depending upon the filtered output from the inverter 58. In this embodiment, the PLL_LOCK output is in either a high state to indicate a true phase lock or a low state otherwise.

In the embodiment shown in FIG. 5, the RC time constant is designed to filter out narrow pulses resulting from small discrepancies between the up and down signals which are the inputs to the XOR gate 29. In contrast to FIG. 2A, which shows perfectly matched up and down signal pulses to indicate a perfect phase lock as described above, in practice some small variations between the up and down signal pulses need be allowed even if the phase locked loop is in a steady-state phase lock. However, even a slight mismatch between the up and down signal pulses may be detected by the XOR gate 29 in FIG. 5, which may generate a narrow XORed pulse indicating such a mismatch. The low pass filter 42 is thus designed with a passband in dependence upon a predetermined threshold pulse width representing a maximum allowable variation between the corresponding edges of the up and down signal pulses, in order to filter out XORed pulses having pulse widths narrower than the threshold pulse width.

Compared to the frequency response of the loop filter 24 in the phase locked loop of FIG. 4, which generates the phase locking control voltage $V_c$ and therefore need be highly sensitive to variations in the up and down signal pulses generated by the phase/frequency detector 18, the filter 42 in the phase lock detector 34 of FIG. 5 may be designed to filter out pulses that are wider than those which are filtered out by the loop filter 24. Because the phase lock detector 34 is provided to indicate a steady-state "true" phase lock rather than to closely track the variations in the up and down signals, the filter 42 in the phase lock detector 34 may be designed to filter out narrow pulses which would still be passed by the loop filter 24 in the phase locked loop of FIG. 4, to allow for some small excursions in the up and down signals. The passband of the low pass filter 42 in FIG. 5 may thus be narrower than the passband of the loop filter 24 in FIG. 4. In other words, the RC time constant of the low pass filter 42 in the lock detector 34 of FIG. 5 may be greater than that of the loop filter 24 in the phase locked loop of FIG. 4.

As illustrated in the curve ($V_c$ vs. t) of FIG. 3, a true phase lock is deemed to have been achieved at point C when the phase lock detector in the phase locked loop according to the present invention determines that the variation between the up and down signals generated by the phase/frequency detector is sufficiently small to be within the predetermined threshold. After the input pad clock signal CLK is initially supplied to the phase/frequency detector 18 in the phase locked loop, the phase/frequency detector 18 may generate up and down signals with relatively large variations during the transient state because the phase locked loop has not yet achieved a true phase lock, due to the initially large variations in the phases and frequencies of the input pad clock signal CLK and the feedback signal FB.

Prior to achieving the true steady-state phase lock, the loop filter control voltage $V_c$, which determines the output frequency of the voltage controlled oscillator, may reach the desired steady-state control voltage $V_c'$ at points A and B. However, the loop filter control voltage $V_c$ does not settle at or near the voltage $V_c'$ until the phase locked loop is able to achieve a steady-state phase lock at point C. When the response curve ($V_c$ vs. t) crosses the steady-state voltage level $V_c'$ at point A or B as shown in FIG. 3, the phase locked loop is said to be in a "false" phase lock because the phase locked loop output signal PLL_OUT has not settled at or near the desired phase locked frequency. A lock detector 34 according to the present invention is thus able to provide the phase lock indicator signal PLL_LOCK to signify that a "true" phase lock has been achieved at point C.

The phase locked loop with the lock detector according to the present invention is applicable to various applications in which a phase locked clocking signal is desired. A conventional matrix clock tree in a typical FPGA is merely one of many examples to which the phase locked loop according to the present invention is applicable. However, the present invention is not limited to such an application. Furthermore, the circuit diagram as shown in FIG. 5 illustrates only an example of a circuit design for the phase lock detector according to the present invention. It will be appreciated that other circuit designs can also be contemplated which perform the function of detecting a true phase lock. The phase locked loop according to the present invention is able to avoid a false phase lock prior to achieving a steady state while obviating the need for a long fixed time delay after the clock start to ensure that the clock signal generated by the phase locked loop is truly phase locked.

The invention has been described with respect to particular embodiments thereof, and numerous modifications can be made which are within the scope of the invention as set forth in the claims.

What is claimed is:

1. A phase locked loop, comprising:
    a phase locking circuit comprising a phase detector having inputs capable of receiving an input clock signal and a feedback signal, and outputs capable of outputting an up signal and a down signal in dependence upon a phase difference between the input clock signal and the feedback signal; and
    a phase lock detector, having inputs coupled to the phase detector, capable of detecting a difference between the up and down signals and in response generating a phase lock indicator signal in dependence upon whether the difference between the up and down signals is within a predetermined threshold difference, the phase lock detector comprising:
        an XOR gate having inputs coupled to receive the up and down signals, capable of generating a pulse signal representing a difference between the up and down signals; and
        a filter, coupled to the XOR gate, capable of filtering out the pulse signal if the pulse signal has a pulse width narrower than a predetermined threshold pulse width representing the predetermined threshold difference between the up and down signals.

2. The phase locked loop of claim 1, wherein the phase locking circuit further comprises a charge pump, coupled to the phase detector, capable of generating a pump current in response to the up and down signals.

3. The phase locked loop of claim 2, wherein the phase locking circuit further comprises a voltage controlled oscillator, coupled to the charge pump, capable of generating a phase locked signal at an oscillator frequency in response to the pump current.

4. The phase locked loop of claim 3, wherein the phase locking circuit further comprises a loop filter, coupled between the charge pump and the voltage controlled oscillator, capable of filtering the pump current to generate a voltage for the voltage controlled oscillator.

5. The phase locked loop of claim 4, wherein the loop filter comprises a low pass filter.

6. The phase locked loop of claim 3, wherein the phase locking circuit further comprises an output frequency divider, coupled to the voltage controlled oscillator, capable of dividing the oscillator frequency of the phase locked signal to generate a phase locked output signal.

7. The phase locked loop of claim 1, wherein the phase lock detector further comprises an inverter coupled between the XOR gate and the filter.

8. The phase locked loop of claim 7, wherein the phase lock detector further comprises:
    a disable input capable of disabling the phase lock indicator signal; and
    a transistor network coupled to the filter and the disable input.

9. The phase locked loop of claim 8, wherein the phase lock detector further comprises:
    a Schmitt trigger coupled to the filter;
    a first inverter coupled to the Schmitt trigger;
    a second inverter coupled to the disable input;
    a NAND gate coupled to the first and second inverters; and
    a third inverter having an input coupled to the NAND gate and an output capable of generating the phase lock indicator signal.

10. The phase locked loop of claim 1, wherein the filter in the phase lock detector comprises a low pass filter having a passband in dependence upon the predetermined threshold pulse width.

11. The phase locked loop of claim 10, wherein the phase locking circuit further comprises:
    a charge pump coupled to the phase detector; and
    a low pass loop filter, coupled to the charge pump, having a passband wider than that of the low pass filter in the phase lock detector.

12. A phase locked loop, comprising:
    a phase locking circuit comprising a phase detector having inputs capable of receiving an input clock signal and a feedback signal, and outputs capable of outputting an up signal and a down signal in dependence upon a phase difference between the input clock signal and the feedback signal; and
    means for detecting a phase lock, coupled to detect a difference between the up and down signals from the phase detector, capable of generating a phase lock indicator signal in dependence upon whether the difference between the up and down signals is within a predetermined threshold difference, the means for detecting the phase lock comprising:
        an XOR gate having inputs coupled to receive the up and down signals, capable of generating a pulse signal representing a difference between the up and down signals; and
        a filter, coupled to the XOR gate, capable of filtering out the pulse signal if the pulse signal has a pulse width narrower than a predetermined threshold pulse width representing the predetermined threshold difference between the up and down signals.

13. The phase locked loop of claim 12, wherein the phase locking circuit further comprises a charge pump, coupled to the phase detector, capable of generating a pump current in response to the up and down signals.

14. The phase locked loop of claim 13, wherein the phase locking circuit further comprises a voltage controlled oscillator, coupled to the charge pump, capable of generating a phase locked signal at an oscillator frequency in response to the pump current.

15. The phase locked loop of claim 14, wherein the phase locking circuit further comprises a loop filter, coupled between the charge pump and the voltage controlled oscillator, capable of filtering the pump current to generate a voltage for the voltage controlled oscillator.

16. The phase locked loop of claim 15, wherein the loop filter comprises a low pass filter.

17. The phase locked loop of claim 14, wherein the phase locking circuit further comprises an output frequency divider, coupled to the voltage controlled oscillator, capable of dividing the oscillator frequency of the phase locked signal to generate a phase locked output signal having an output frequency.

18. The phase locked loop of claim 12, wherein the means for detecting the phase lock further comprises an inverter coupled between the XOR gate and the filter.

19. The phase locked loop of claim 12, wherein the means for detecting the phase lock further comprises:

a disable input capable of disabling the phase lock indicator signal; and a transistor network coupled to the filter and the disable input.

20. The phase locked loop of claim 19, wherein the means for detecting the phase lock further comprises:

a Schmitt trigger coupled to the filter;

a first inverter coupled to the Schmitt trigger;

a second inverter coupled to the disable input;

a NAND gate coupled to the first and second inverters; and a third inverter having an input coupled to the NAND gate and an output capable of generating the phase lock indicator signal.

21. The phase locked loop of claim 12, wherein the filter in the means for detecting the phase lock comprises a low pass filter having a passband in dependence upon the predetermined threshold pulse width.

22. The phase locked loop of claim 21, wherein the phase locking circuit further comprises:

a charge pump coupled to the phase detector; and a low pass loop filter, coupled to the charge pump, having a passband wider than that of the low pass filter in the means for detecting the phase lock.

23. A phase locked loop, comprising:

a phase detector having inputs capable of receiving an input clock signal and a feedback signal, and outputs capable of outputting an up signal and a down signal in dependence upon a phase difference between the input clock signal and the feedback signal;

a charge pump, coupled to the phase detector, capable of generating a pump current in response to the up and down signals;

a voltage controlled oscillator, coupled to the charge pump, capable of generating a phase locked signal at an oscillator frequency in response to the pump current; and a phase lock detector, having inputs coupled to the phase detector, capable of detecting a difference between the up and down signals and in response generating a phase lock indicator signal in dependence upon whether the difference between the up and down signals is within a predetermined threshold difference, the phase lock detector comprising:

an XOR gate having inputs coupled to receive the up and down signals, capable of generating a pulse signal representing a difference between the up and down signals; and a filter, coupled to the XOR gate, capable of filtering out the pulse signal if the pulse signal has a pulse width narrower than a predetermined threshold pulse width representing the predetermined threshold difference between the up and down signals.

24. The phase locked loop of claim 23, further comprising a loop filter, coupled between the charge pump and the voltage controlled oscillator, capable of filtering the pump current to generate a voltage for the voltage controlled oscillator.

25. The phase locked loop of claim 24, wherein the loop filter comprises a low pass filter.

26. The phase locked loop of claim 23, further comprising an output frequency divider, coupled to the voltage controlled oscillator, capable of dividing the oscillator frequency of the phase locked signal to generate a phase locked output signal having an output frequency.

27. The phase locked loop of claim 23, wherein the phase lock detector further comprises an inverter coupled between the XOR gate and the filter.

28. The phase locked loop of claim 23, wherein the phase lock detector further comprises:

a disable input capable of disabling the phase lock indicator signal; and a transistor network coupled to the filter and the disable input.

29. The phase locked loop of claim 28, wherein the phase lock detector further comprises:

a Schmitt trigger coupled to the filter;

a first inverter coupled to the Schmitt trigger;

a second inverter coupled to the disable input;

a NAND gate coupled to the first and second inverters; and a third inverter having an input coupled to the NAND gate and an output capable of generating the phase lock indicator signal.

30. The phase locked loop of claim 23, wherein the filter in the phase lock detector comprises a low pass filter having a passband in dependence upon the predetermined threshold pulse width.

31. The phase locked loop of claim 30, wherein the phase locking circuit further comprises a low pass loop filter, coupled to the charge pump, having a passband wider than that of the low pass filter in the phase lock detector.

32. In a phase locked loop which comprises a phase detector having outputs capable of outputting an up signal and a down signal in dependence upon a phase difference between an input clock signal and a feedback signal, a phase lock detector for generating a phase lock indicator signal comprising:

an XOR gate having inputs coupled to receive the up and down signals, capable of generating a pulse signal representing a difference between the up and down signals; and a filter, coupled to the XOR gate, capable of filtering out the pulse signal if the pulse signal has a pulse width narrower than a predetermined threshold pulse width.

33. The phase lock detector of claim 32, further comprising an inverter coupled between the XOR gate and the filter.

34. The phase lock detector of claim 32, further comprising:

a disable input capable of disabling the phase lock indicator signal; and a transistor network coupled to the filter and the disable input.

35. The phase lock detector of claim 34, further comprising:
a Schmitt trigger coupled to the filter;
a first inverter coupled to the Schmitt trigger;
a second inverter coupled to the disable input;
a NAND gate coupled to the first and second inverters; and
a third inverter having an input coupled to the NAND gate and an output capable of generating the phase lock indicator signal.

36. The phase lock detector of claim 32, wherein the filter comprises a low pass filter having a passband in dependence upon the predetermined threshold pulse width.

* * * * *

UNITED STATES PATENT AND TRADEMARK OFFICE
CERTIFICATE OF CORRECTION

PATENT NO. : 6,133,769
DATED : October 17, 2000
INVENTOR(S) : Fontana et al.

It is certified that error appears in the above-identified patent and that said Letters Patent is hereby corrected as shown below:

Column 10, Claim 8, line 1, delete "claim 7" and insert
--claim 1-- therefor.

Signed and Sealed this

Eighth Day of May, 2001

Attest:

NICHOLAS P. GODICI

Attesting Officer    Acting Director of the United States Patent and Trademark Office